(12) United States Patent
Lee (10) Patent No.: US 10,172,257 B2
(45) Date of Patent: Jan. 1, 2019

(54) HEAT DISSIPATION MODULE AND ELECTRONIC DEVICE HAVING THE SAME

(71) Applicant: Synology Inc., Taipei (TW)

(72) Inventor: Cheng-Huang Lee, Taipei (TW)

(73) Assignee: SYNOLOGY INC., Taipei (TW)

( * ) Notice: Subject to any disclaimer, the term of this patent is extended or adjusted under 35 U.S.C. 154(b) by 0 days.

(21) Appl. No.: 15/684,185

(22) Filed: Aug. 23, 2017

(65) Prior Publication Data

US 2018/0124946 A1    May 3, 2018

(30) Foreign Application Priority Data

Nov. 2, 2016    (TW) .............................. 105135453 A (51) Int. Cl.
*H05K 7/20*    (2006.01)
*H05K 5/00*    (2006.01)

(52) U.S. Cl.
CPC ....... *H05K 7/20127* (2013.01); *H05K 5/0026* (2013.01); *H05K 7/20709* (2013.01)

(58) Field of Classification Search
CPC .. H05K 5/0247; H05K 5/0217; H05K 5/0004; H05K 5/069; H05K 7/1427; H05K 5/0021; H05K 7/20; H05K 5/00; H05K 7/20127; H05K 7/20709; H05K 5/0026; G02F 2201/36; G06F 1/16; G06F 1/181

USPC ....... 361/752, 679.46, 724, 679.5, 695, 756, 361/679.01, 679.02, 728; 165/104.33, 165/80.3; 174/50, 520; 312/223.2
See application file for complete search history.

(56) References Cited

U.S. PATENT DOCUMENTS 7,046,513 B2 *  5/2006  Nishiyama ......... H05K 7/20572
                                                            165/122
7,304,855 B1 * 12/2007  Milligan .............. G11B 33/128
                                                            361/724

FOREIGN PATENT DOCUMENTS

TW            201622542 A        6/2016

\* cited by examiner

*Primary Examiner* — Dion R Ferguson
*Assistant Examiner* — Mandeep S Buttar
(74) *Attorney, Agent, or Firm* — McClure, Qualey & Rodack, LLP (57) ABSTRACT

A heat dissipation module is provided. The heat dissipation includes a base, a frame, and a positioning member. The frame is disposed on the base and has a passage for containing an electronic component. At least a segment of the edge of the frame that is adjacent to the base is distant from the base so as to form an air path inlet that communicates with the passage therebetween. The positioning member is disposed in the passage and is connected to the frame and configured to position an electronic assembly in the frame.

14 Claims, 5 Drawing Sheets

HEAT DISSIPATION MODULE AND ELECTRONIC DEVICE HAVING THE SAME

CROSS REFERENCE TO RELATED APPLICATIONS

This Application claims priority of Taiwan Patent Application No. 105135453, filed on Nov. 2, 2016, the entirety of which is incorporated by reference herein.

BACKGROUND OF THE INVENTION

Field of the Invention

The disclosure relates to a heat dissipation module and an electronic device using the heat dissipation module, and more particularly to a heat dissipation module operated by passive heat dissipation principle, and an electronic device using the heat dissipation module.

Description of the Related Art

With the increasing speed of network data transmission, when a computer server processes data operations, massive data needs to be stored in storage units (such as disk drives, hard disk drives, solid state drives (SSD), etc.). During the data operations, the heat generated by the storage unit may affect the performance of the storage unit itself or other adjacent electronic components. It is desired to remove the excess heat to make sure all the electronic components and storage units well performed in the computer server, so as to reduce the failure risk of the computer server.

Conventionally, a cooling fan can be mounted in the computer server to dissipate the excess heat. By using the cooling fan to direct the airflow from inside to outside, the internal heat can be excluded continuously. However, the active cooling mechanism not only requires the additional cost associated with installing a cooling fan, but also consumes additional power to drive the cooling fan.

In addition, in a conventional storage unit fixing assembly, the storage unit is fixed by a positioning mechanism. However, the above-described positioning mechanism includes a large number of components and the assembly method is complicated, which may increase the production cost. Furthermore, the positioning mechanism is generally made of a plastic material with thermal conductivity ranged from 0.1 to 0.2 w/m*k. Such low thermal conductivity may have negative influence to heat dissipation.

BRIEF SUMMARY OF THE INVENTION

In view of the drawbacks of the prior art, one of the objectives of the present invention is to provide a heat dissipation module which can assist in the thermal dissipation of an electronic assembly. Another objective of the present disclosure is to provide a heat dissipation module which can quickly be engaged and disengaged from an electronic assembly and has the advantage of having a small number of components and easy assembly.

In accordance with some embodiments of the disclosure, the heat dissipation module includes a base, a frame and a positioning member. The frame is disposed on the base and has a passage for receiving the electronic assembly. The edge of the frame that is adjacent to the base is distant from the base. An air path inlet is formed between the segment of the frame and the base and communicates with the passage. The positioning member is disposed in the passage and connected to a surface of the frame. When the electronic assembly is disposed in the passage, the electronic assembly is abutted against the positioning member, and there is a gap formed between the positioning member and the surface that allows an air current to flow through.

Another objective of the disclosure is to provide an electronic device. The electronic device includes the heat dissipation module mentioned above and a circuit board, wherein the base has an upper surface and a lower surface that is positioned relative to the upper surface, and a through hole penetrates the upper surface and the lower surface of the base. The frame is disposed on the upper surface of the base. The circuit board is disposed on the lower surface of the base. The circuit board includes an electronic connector disposed in the through hole and exposed by the upper surface. When the electronic assembly is disposed in the passage, the electronic assembly is electrically connected to the electronic connector.

BRIEF DESCRIPTION OF THE DRAWINGS

For a more complete understanding of the embodiments and the advantages thereof, reference is now made to the following descriptions taken in conjunction with the accompanying drawings.

DETAILED DESCRIPTION OF THE INVENTION

In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

It should be noted that the elements or devices in the drawings of the present disclosure may be present in any form or configuration known to those skilled in the art. In addition, the expression "an element is disposed on another element" may indicate that the element directly contacts the other element, or it may indicate that the element does not directly contact the other element, there being one or more intermediate elements disposed between the element and the other element.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean+/−20% of the stated value, more typically +/−10% of the stated value and even more typically +/−5% of the stated value. The stated value of the present disclosure is an approximate value. When there is no specific description, the stated value includes the meaning of "about" or "substantially".

Figure 1:
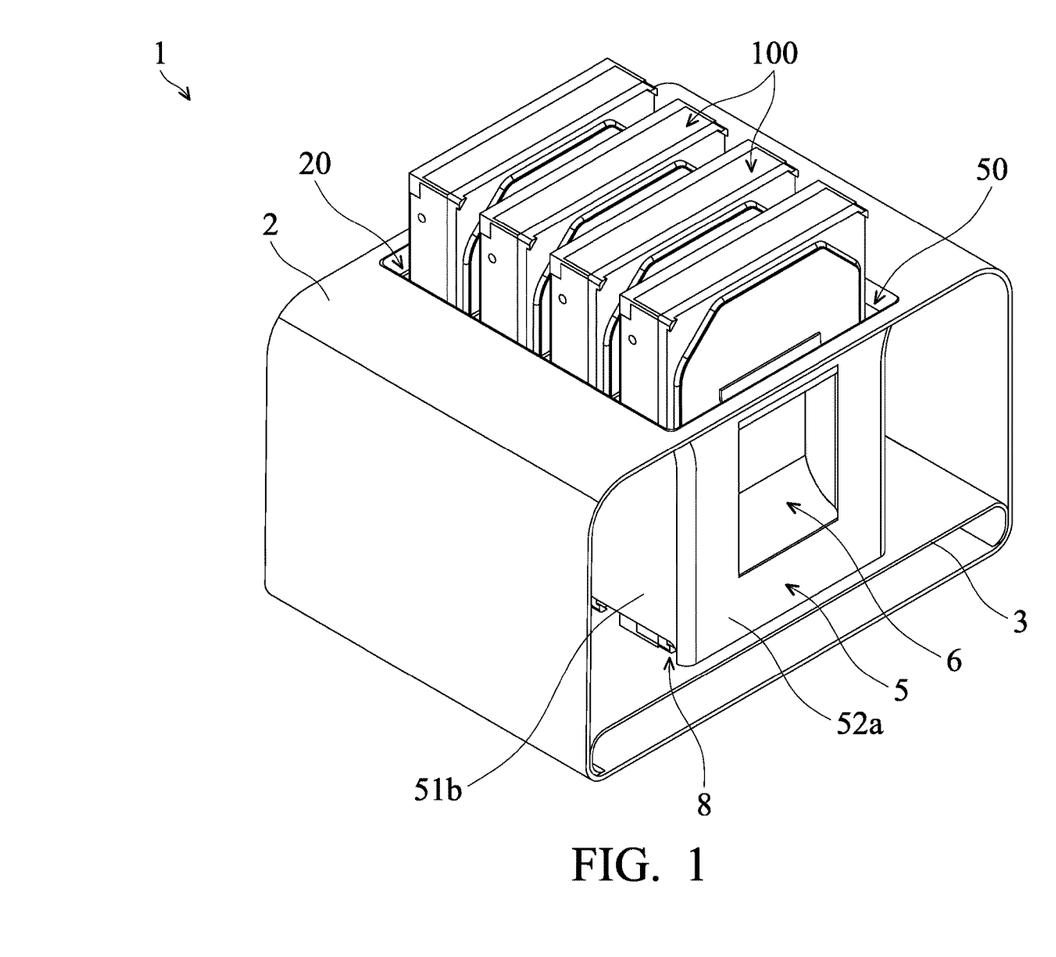
FIG. 1 is a schematic view of an electronic device, in accordance with some embodiments of the disclosure, in which a number of electronic assemblies are disposed in the electronic device.

FIG. 1 is a schematic view of an electronic device 1 in accordance with some embodiments of the disclosure. The electronic device 1 of the disclosure is configured to receive one or more electronic assemblies 100, such as a hard disc drive (HDD), in a removable manner. When the electronic assembly 100 is disposed in the electronic device 1, the electronic device 1 supplies power for driving the electronic assembly 100, and the electronic assembly 100 performs data transfer and data reception via the electronic device 1 and other electronic devices (not shown in figures). For example, the electronic assembly 100 may perform data transmission to another electronic device via a wired or wireless network.

Figure 2:
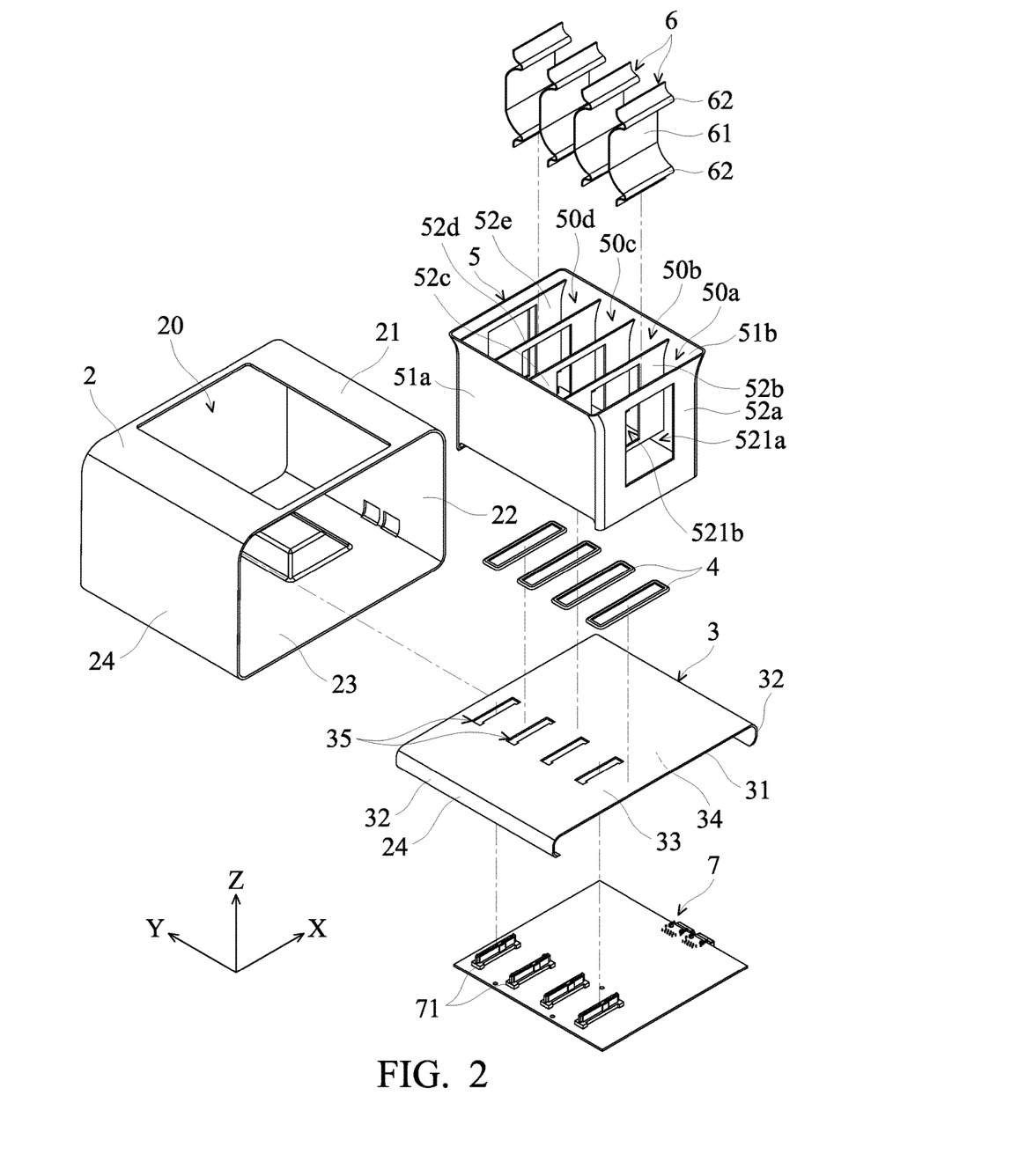
FIG. 2 is an exploded view of an electronic device in accordance with some embodiments of the disclosure.

FIG. 2 is an exploded view of an electronic device 1 in accordance with some embodiments of the disclosure. In some embodiments, the electronic device 1 includes a housing 2, a base 3, and a number of buffering pads 4, a frame 5, a number of positioning members 6 and a circuit board 7. The elements of the electronic device 1 can be added or eliminated according to actual need and should not be limited to the embodiments.

In some embodiments, the housing 2 includes a number of lateral housing members, such as lateral housing members 21, 22, 23 and 24. The lateral housing member 21 is positioned relative to the lateral housing member 23. The lateral housing member 22 is positioned relative to the lateral housing member 24. The lateral housing member 22 connects one edge of the lateral housing member 21 to a corresponding edge of the lateral housing member 23. The lateral housing member 24 connects another edge of the lateral housing member 21 to a corresponding edge of the lateral housing member 23. In an embodiment, when the housing 2 is positioned on a flat surface (such as a desk), the lateral housing member 23 is the bottom surface of the housing 2, and directly faces the above mentioned flat surface. Meanwhile, lateral housing member 21 is the top surface of the housing 2, and an opening 20 is formed on lateral housing member 21. The electronic assembly 100 can be disposed in the electronic device 1 via the opening 20 of the housing 2. However, it should be appreciated that many variations and modifications can be made to embodiments of the disclosure.

The base 3 is disposed on the lateral housing member 23 and is configured to fix the frame 5 and the circuit board 7. In some embodiments, the base 3 includes a platform 31 and two supporting structures 32. The platform 31 has an upper surface 33 and a lower surface 34 positioned relative to the upper surface 33, and the lower surface 34 directly faces the lateral housing member 23. In some embodiments, the two supporting structures 32 are respectively formed on two edges of the lower surface 34 of the platform 31, and face the lateral housing member 22 and the lateral housing member 24. The two supporting structures 32 extend in a direction away from the lower surface 34. The base 3 is disposed on the lateral housing member 23 via the two supporting structures 32 such that the platform 31 and the lateral housing member 23 are arranged in a way that they are separated from each other. In some embodiments, a number of through holes 35 penetrate the upper surface 33 and the lower surface 34 of the platform 31, so as to allow the electrical connection between the electronic assembly 100 (See FIG. 1) and the circuit board 7. In an embodiment, the base 3 may be made of material having high thermal conductivity, such as SUS304, SUS301, SGCC, SECC or SPCC.

In some embodiments, the circuit board 7 is disposed on the lower surface 34 of the platform 31 and includes a number of electronic connectors 71. The electronic connectors 71 are disposed in the through holes 35 of the base 3. In some embodiments, a number of buffering pads 4 surround the corresponding through holes 35 and are disposed on the upper surface 33 of the platform 31. The buffering pad 4 is configured for providing a buffer between the electronic assembly 100 (See FIG. 1) and the platform 31, to prevent damage to the electronic assembly 100 due to vibration. The buffering pad 4 may be made of material such as rubber.

Figure 3:
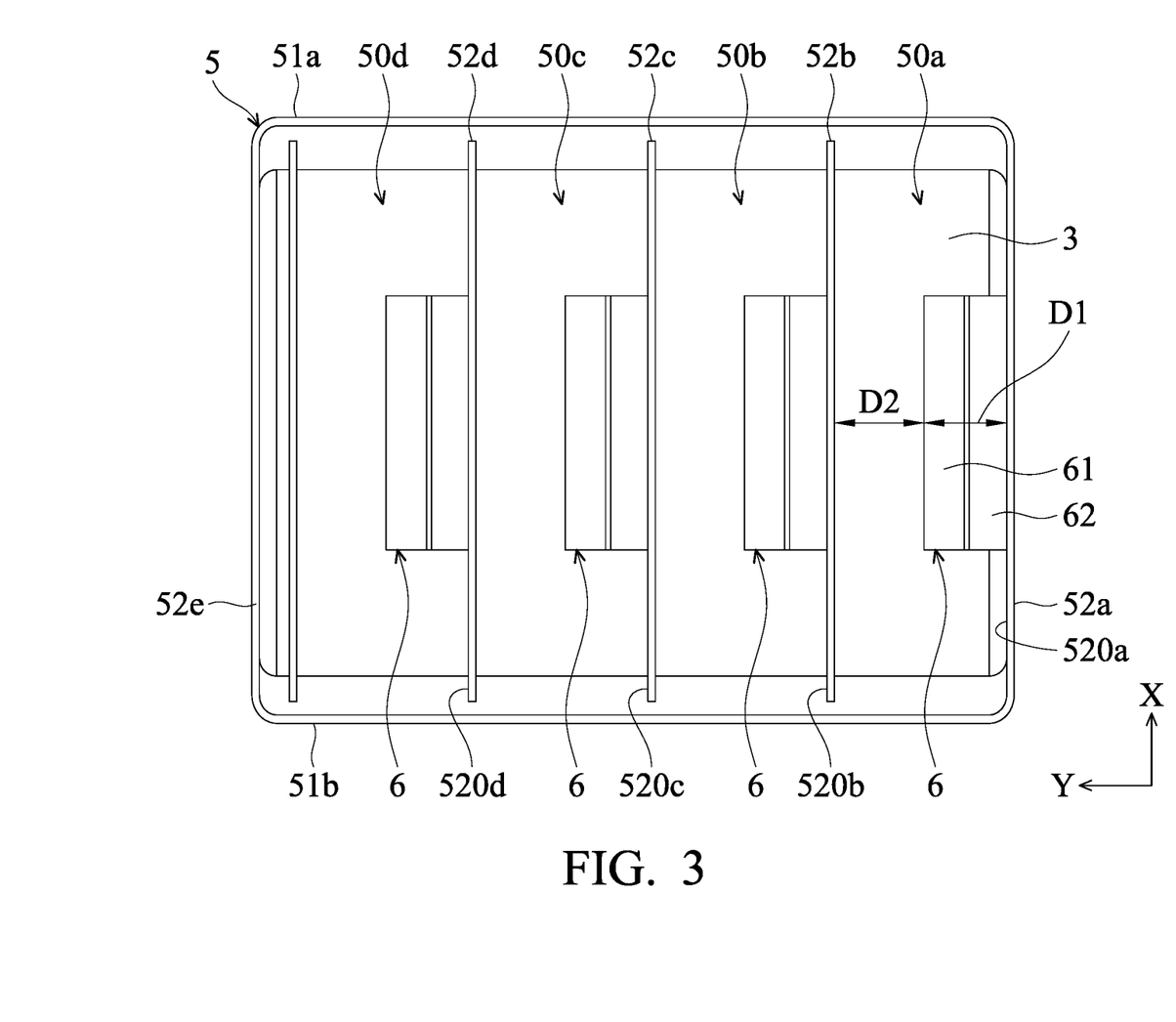
FIG. 3 is a top view of partial elements including a base, a frame and a positioning member in accordance with some embodiments of the disclosure.

FIG. 3 is a top view of partial elements including the base 3, the frame 5, and the positioning member 6 in accordance with some embodiments of the disclosure. The frame 5 is disposed on the upper surface 33 of the platform 31 and is configured for receiving the electronic assembly 100.

In some embodiments, the frame 5 includes a number of panels, such as two transversal panels 51a and 51b and five longitudinal panels 52a, 52b, 52c, 52d and 52e. The two transversal panels 51a and 51b are arranged along the X direction and parallel to each other. In addition, the two longitudinal panels 52a and 52e are arranged along the Y direction and parallel to each other. The longitudinal panels 52a connects one edge of the traversal panel 51a to a corresponding edge of the traversal panel 51b. The longitudinal panels 52e connects another edge of the traversal panel 51a to a corresponding edge of the traversal panel 51b.

In some embodiments, three longitudinal panels 52b, 52c and 52d are located between the two longitudinal panels 52a, 52e. Each of the longitudinal panels 52b, 52c and 52d connects the transversal panel 51a to the transversal panel 51b. As a result, as shown in FIG. 2 and FIG. 3, four passages 50a, 50b, 50c and 50d facing the opening 20 and extending in a direction (the Z direction) that is perpendicular to the platform 31 are defined by the frame 5. The width of each passage 50a, 50b, 50c and 50d can be sufficiently greater than the width of the electronic assembly 100 which is going to be received. In various embodiments, the width of each passage 50a, 50b, 50c and 50d can be the same or different.

However, it should be appreciated that many variations and modifications can be made to embodiments of the disclosure. The number of passages can be added or removed according to the number of electronic assemblies which are going to be disposed therein. For example, when the electronic device is used to receive only one electronic assembly, the three longitudinal panels 52b, 52c and 52d can be omitted, and the width of the two transversal panels is substantially equal to the width of the passage 50a shown in FIG. 3. Therefore, only one passage is defined within the frame 5.

Each of the panels of the frame 5 may be connected together by wielding. Alternatively, a portion of the frame 5 is formed integrally, and a portion of the frame is connected together by means such as wielding. The frame 5 may be made of material having high thermal conductivity, such as SUS304, SUS301, SGCC, SECC or SPCC.

Figure 4:
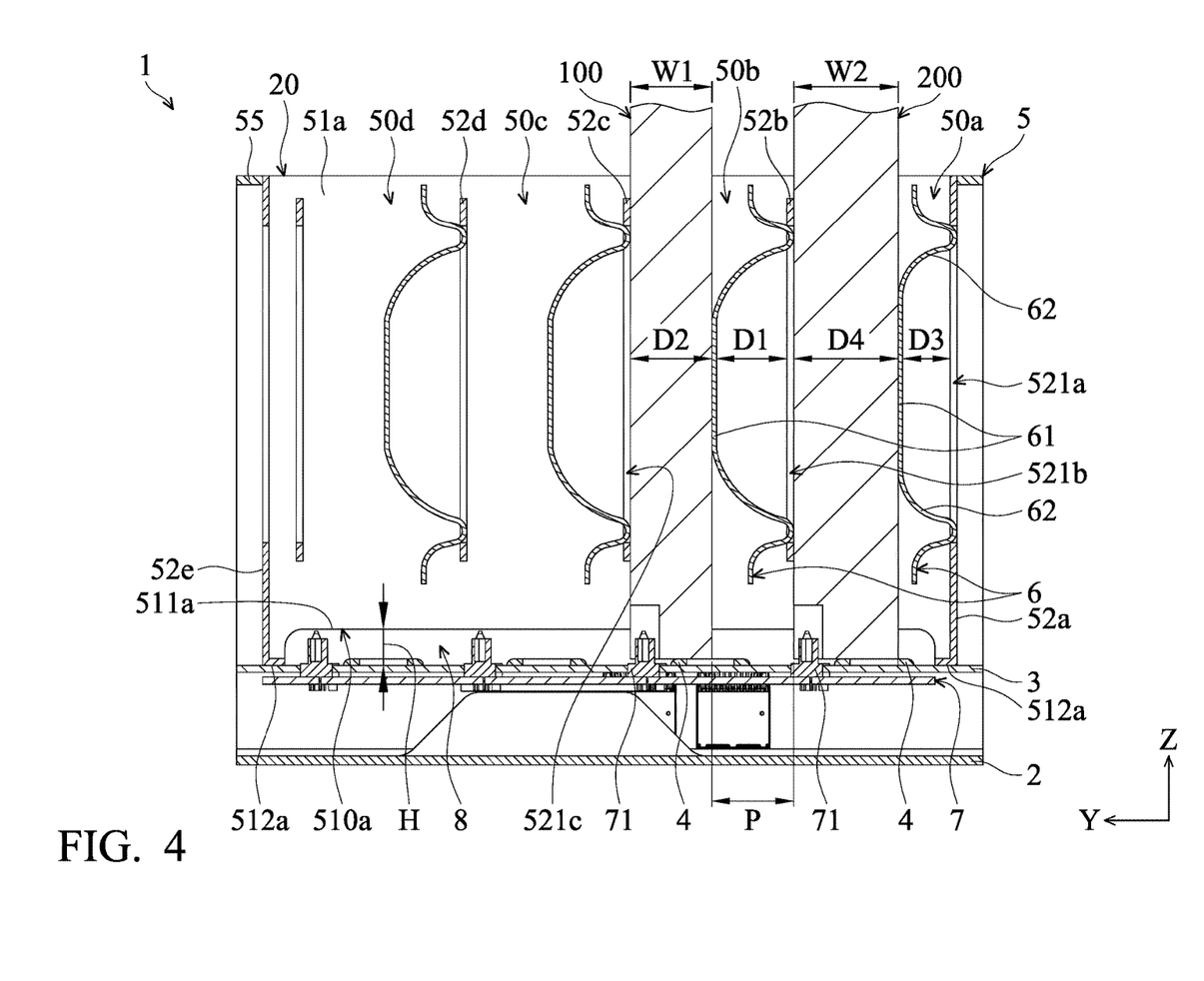
FIG. 4 is a cross-sectional view of the electronic device in accordance with some embodiments of the disclosure, in which two electronic assemblies having different widths are disposed in the electronic device.

FIG. 4 is a cross-sectional view of the electronic device 1 in accordance with some embodiments of the disclosure. In some embodiments, an edge 510a of the frame 5 that is adjacent to the base 3 is not entirely in contact with the base 3, and a segment of the edge of the frame 5 that is adjacent to the base 5 is distant from the base 3, so as to define one or more air path inlets 8 between the frame 5 and the base 3. For example, as shown in FIG. 4, the edge 510a of the frame 5 that is adjacent to the base 5 includes a first segment 511a and two second segments 512a located at two sides of the first segment 511a, in which the first segment 511a is distant from the base 3, and an air path inlet 8 is defined between the first segment 511a of the transversal panel 51a and the base 3. The configuration of the transversal panel 51b is similar to that of the transversal panel 51a and is not repeated for brevity. In an embedment, the height H of the air path inlet 8 (the distance between the bottom edge of the transversal panel 51 and the base 3) may be about 5 mm.

In the embodiments mentioned above, while the edges of the two longitudinal panels 52a and 52e are in direct contact with the base 3, and no gap is formed between the base 3 and the two longitudinal panels 52a and 52e, it should be appreciated that many variations and modifications can be made to embodiments of the disclosure. In some embodiments, some portions of the edges of the two longitudinal panels 52a and 52e that are adjacent to the base 3 are distant from the base 3. Therefore, in addition to the air path inlet 8 shown in FIG. 4, there are one or more air path inlets defined between the two longitudinal panels 52a and 52e and the base 3.

In some embodiments, the edge of the frame 5 that is adjacent to the base 3 has a number of air path inlets, corresponding to the number of passages, which are spaced apart from each other. For example, the transversal panel 51a defines four air path inlets, wherein the four air path inlets independently communicate with one of the passages 50a, 50b, 50c and 50d.

Figure 5:
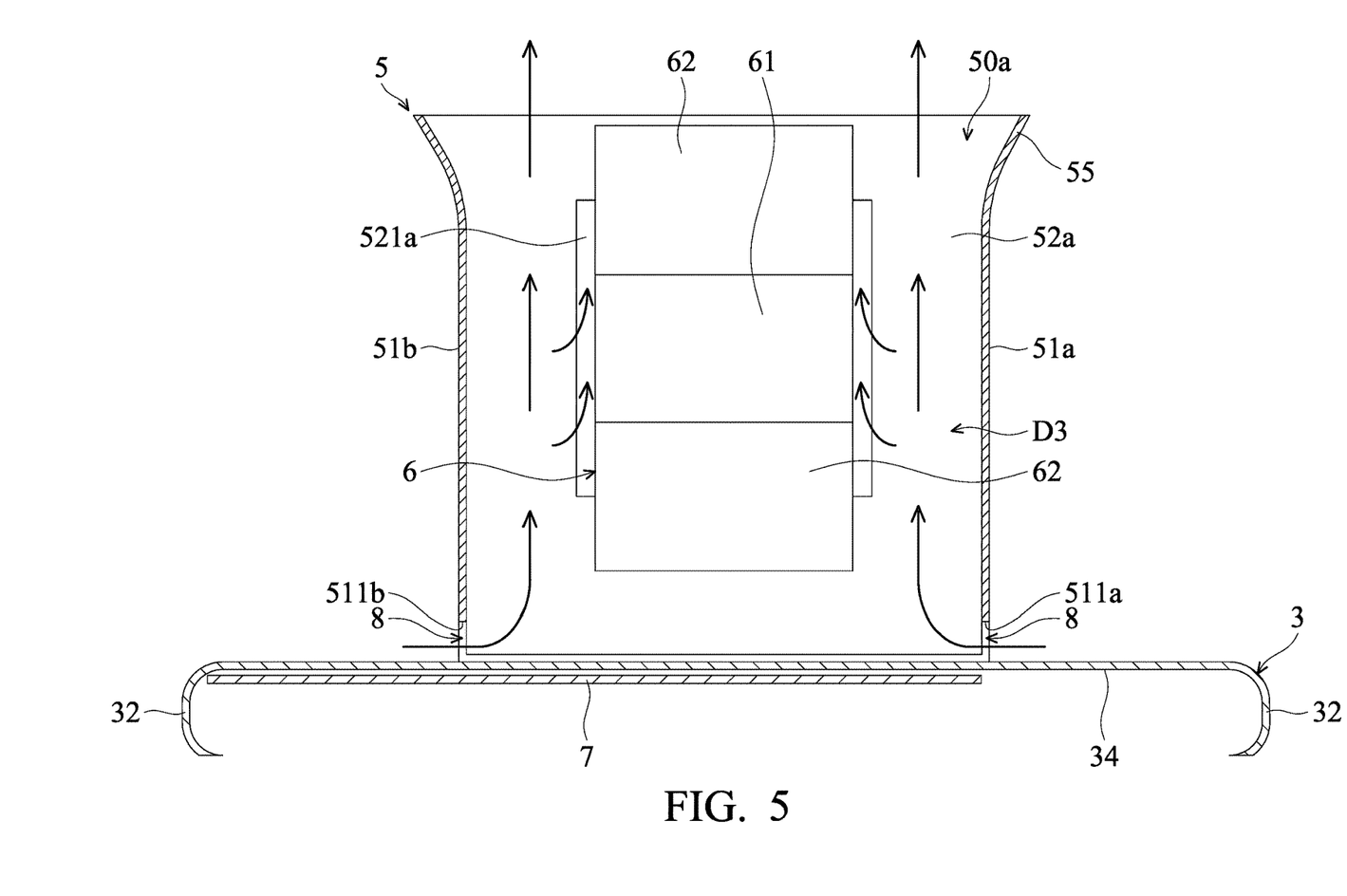
FIG. 5 is a schematic view of a portion of structures of an electronic device in accordance with some embodiments of the disclosure, in which an air current passes through a passage in a frame.

In some embodiments, one side of some panels of the frame 5 that is approximate to the base 3 has a curved structure extending outwardly. For example, as shown in FIG. 4 and FIG. 5, one side of each transversal panel 51a and 51b of the frame 5 that is approximate to the base 3 has a curved structure 55 extending outwardly. The curved structure 55 extends a predetermined distance in a direction that is parallel to the base 3. The advantages of the curved structure 55 will be described in greater detail in FIG. 5.

In some embodiments, some panels of the frame 5 have an opening formed thereon to increase heat dissipation efficiency. For example, as shown in FIG. 4, the transversal panels 52a, 52b and 52c are penetrated by openings 521a, 521b and 521c. The openings 521a, 521b and 521c respectively face the positioning member 6 located in the passages 50a, 50b and 50c.

Referring back to FIG. 3, there is a positioning member 6 disposed in each of the passages 50a, 50b, 50c and 50d, and now referring to FIG. 4, an orthogonal projection of the opening 20 of the housing 2 on the base 3 overlaps with an orthogonal projection P of the positioning member 6 on the base 3. The positioning members 6 are configured to constrain the position of the electronic assemblies 100, when the electronic assemblies 100 are disposed in the passages 50a, 50b, 50c and 50d.

In some embodiments, the positioning members 6 are made of metal sheets having high thermal conductivity such as SUS304 or SK5 and each includes a middle portion 61 and two side portions 62. The middle portion 61 has a flat surface, and the two side portions 62 are connected to two opposite sides of the middle portion 61 and each forms an angle relative to the middle portion 61, in which the angle is greater than 90 degrees. As a whole, each of the positioning members 6 substantially has an arc shape. In some embodiments, as shown in FIG. 4, the positioning members 6 are disposed on the surfaces 520a, 520b, 520c and 520d of the longitudinal panels 52a, 52b, 52c and 52d via the side portions 62. As a result, the positioning members 6 protrude from the corresponding surfaces 520a, 520b, 520c and 520d of the longitudinal panel 52a, 52b, 52c and 52d.

In some embodiments, there is a gap formed between the middle portion 61 of the positioning member 6 and the longitudinal panel on which the positioning member 6 is disposed, and there is a gap formed between the middle portion 61 of the positioning member 6 and the neighboring longitudinal panel. The middle portion 61 is not in direct contact with the longitudinal panels. For example, as shown in FIG. 3, the middle portion 61 of the positioning member 6 is separated from the surface of 520a of the longitudinal panel 52a on which the positioning member 6 is disposed by a gap D1, and the middle portion 61 of the positioning member 6 is separated from the neighboring longitudinal panel 52b by a gap D2. The other positioning members 6 shown in FIG. 3 are arranged in the same configuration.

In accordance with some embodiments, the method for operating the electronic device 1 is described below:

Referring to FIG. 4, in accordance with some embodiments, the passage 50b of the electronic device 1 is used to receive an electronic assembly 100 having a width of W1, and the passage 50a of the electronic device 1 is used to receive an electronic assembly 200 having a width of W2. The size of the electronic assembly 100 and the size of the electronic assembly 200 is different, for example, the thickness of HDD drives/SDD dives may vary among different manufactures/types. In the embodiment shown in FIG. 4, the width W1 of the electronic assembly 100 is equal to the gap D2 and the width W2 the electronic assembly 200 is greater than the gap D2.

In the process of inserting the electronic assembly 100 into the passage 50b, the user continuously applies a thrust force on the electronic assembly 100 to enable the movement of the electronic assembly 100 toward the base 3. When the bottom edge of the electronic assembly 100 is abutted by the positioning member 6, the electronic assembly 100 is guided by the positioning member 6 and moved into a region between the positioning member 6 and the longitudinal panel 52c, so as to align the electric contact of the electronic assembly 100 with the electronic connector 71 in the passage 50b. Afterwards, the electronic assembly 100 is continuously moved toward the base 3 until the electronic assembly 100 is abutted against the buffering pad 4 and electrically connected to the electronic connector 71.

In the above embodiment, after the electronic assembly 100 is inserted into the passage 50b, the middle portion 61 of the positioning member 6 in the passage 50b is separated from the longitudinal panel 52b on which the positioning member 6 is disposed by a gap D1 and is separated from the neighboring longitudinal panel 52b by a gap D2, in which the electronic assembly 100 faces the opening 521b of the longitudinal panel 52*b* and faces the opening 521*c* of the longitudinal panel 52*c*. In addition, as shown in FIG. 1, at least a portion of the electronic assembly 100 is exposed to the outside of the frame 5 to improve heat dissipation efficiency. Moreover, the electronic assembly 100 passes through the opening 20, and a slit is formed between the electronic assembly 100 and the opening 20 for allowing the passing of the air flow. However, it should be appreciated that many variations and modifications can be made to embodiments of the disclosure. The electronic assembly 100 can be entirely disposed in the passage 50*b* without being exposed to the outside of the frame 5.

On the other hand, in the process of inserting the electronic assembly 200 into the passage 50*a*, the user continuously applies a thrust force on the electronic assembly 200 to enable the movement of the electronic assembly 200 toward the base 3. When the bottom edge of the electronic assembly 200 is abutted by the positioning member 6, the electronic assembly 200 is guided by the positioning member 6 and moved into a region between the positioning member 6 and the longitudinal panel 52*b*, so as to align the electric contact of the electronic assembly 200 with the electronic connector 71 in the passage 50*b*. Afterwards, the electronic assembly 200 is continuously moved toward the base 3 until the electronic assembly 200 is abutted against the buffering pad 4 and electrically connected to the electronic connector 71.

In the above embodiments, after the electronic assembly 200 is inserted into the passage 50*a*, the middle portion 61 of the positioning member 6 in the passage 50*b* is separated from the longitudinal panel 52*b* on which the positioning member 6 is disposed by a gap D3 and is separated from the neighboring longitudinal panel 52*b* by a gap D4. In addition, the electronic assembly 200 faces the opening 521*a* of the longitudinal panel 52*a* and faces the opening 521*b* of the longitudinal panel 52*b*. It should be noted that the width W2 of the electronic assembly 200 is greater than the width D2 between the positioning member 6 and the neighboring longitudinal panel 52*b* before the deformation. Therefore, after the electronic assembly 200 is inserted into a region between the positioning member 6 and the longitudinal panel 52*b*, the side portions 62 of the positioning member 6 is compressed by the electronic assembly 200 and deforms, and the middle portion 61 of the positioning member 6 is moved toward the longitudinal panel 52*a* so as to receive the electronic assembly 200 between the positioning member 6 and the longitudinal panel 52*b*.

Referring to FIGS. 4 and 5, the principle of heat dissipation, in accordance with some embodiments of the disclosure, is described below.

In some embodiments, when the electronic assembly 200 is disposed in the electronic device 1, the electronic assembly 200 produces heat during operation. Meanwhile, since the middle portion 61 of the positioning member 6 is in direct contact with the electronic assembly 200, the heat from the electronic assembly 200 is transferred to the frame 5 by conduction, and the heat from the electronic assembly 200 is thereby dissipated.

It should be noted that since there is a flat structure on the middle portion 61 of the positioning member 6, a sufficient contact area is created between the electronic assembly 200 and the positioning member 6, so that the heat from the electronic assembly 200 is efficiently transferred to the positioning member 6. In addition, with the arc shape configuration of the positioning member 6, the heat of the positioning member 6 can be transferred to the surroundings quickly. Moreover, with the design of the curved structure on partial panels of the frame 5, the frame 5 has a larger extension area in the horizontal direction, such that the heat dissipation efficiency from the frame 5 to the air surroundings is improved. Last but not least, since the frame 5 and the circuit board 7 are both disposed on the base 3, the heat from the frame 5 and the circuit board 7 can be transferred to the base 3 via the heat conduction principle so as to decrease the temperature of the frame 5 and the circuit board 7.

In addition to dissipating heat from the electronic assembly 200 and the circuit board 7 by conduction as mentioned above, the heat can be dissipated by thermal convection. Specifically, with the arrangement of the air path inlets 8, the cool air outside the passage 50*a* is able to enter the passage 50*a* via the air path inlets 8. Therefore, a thermal convection current flows through the gap D3 between the electronic assembly 200 and the transversal panel 52*a* and leaves the passage 50*a* via a side of the passage 50*a* that is approximate to the base 3 after flowing through the positioning member 6 and the electronic assembly 200, so as to decrease the temperature of the frame 5, the positioning member 6 and the electronic assembly 200. It should be noted that with the arrangements of the opening 521*a* and 521*b* on the longitudinal panels 52*a* and 52*b*, the heat can be dissipated from the passage 50*a* via the opening 521*a* or the opening 521*b*. In addition, with the arrangement of the two supporting structures 32, a space for air to flow is formed under the lower surface 34 of the base 3. As a result, the heat from the circuit board 7 can be dissipated by the cool air in the space as well.

It should be appreciated that the descriptions of the heat dissipation mechanism for the electronic device 1 should not be limited to the application of the electronic assembly 200, and any electronic assembly disposed in the electronic device 1 can be cooled by the same or a similar method to dissipate heat. Additionally, in the above-mentioned embodiments, while the base 3, the frame 5, and the positioning member 6 are all made of a material having high heat conductivity, the disclosure should not be limited thereto. The heat from the electronic assembly can still be dissipated by thermal convection, even if the base 3, the frame 5 and the positioning member 6 can be made of a material having lower heat conductivity.

Embodiments of the disclosure utilize positioning members for quickly fixing one or more electronic assemblies in a frame. The heat from the electronic assemblies is not dissipated by the positioning member, but is blown away by the cool air current from the lower portion of the frame, such that any unstable condition of the electronic assembly caused by the high temperature is mitigated. In addition, due to the flexible natural of the positioning member, the electronic device can be used to receive electronic assemblies of different widths/thicknesses. Moreover, since elements such as the base, the frame, and the positioning member of the electronic device are made of lightweight material, the weight of the electronic device is reduced, thereby achieving the purpose of lightweight design.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A heat dissipation module, adapted for positioning an electronic assembly, comprising: a base; a frame disposed on the base and having a passage for receiving the electronic assembly, wherein at least one segment of an edge of the frame that is adjacent to the base is distant from the base, and an air path inlet is formed between the at least one segment of the frame and the base and communicates with the passage; and a positioning member disposed in the passage and connected to a surface of the frame, wherein the positioning member comprises a metal sheet, and the metal sheet comprises: a middle portion comprising a flat surface, wherein when the electronic assembly is disposed in the passage, the flat surface of the middle portion is in direct contact with the surface of the electronic assembly; and two side portions connected to two sides of the middle portion, wherein the positioning member is connected to the surface of the frame via the two side portions, and the middle portion is separated from the surface of the frame by the gap; wherein when the electronic assembly is disposed in the passage, the electronic assembly is abutted against the positioning member, and there is a gap formed between the positioning member and the surface that allows an air current to flow through.

2. The heat dissipation module as claimed in claim 1, wherein in the operation of the electronic assembly, the air current flows into the passage via the air path inlet by thermal convection, and the air current passes through the gap and leaves the passage via a side of the passage that is proximate to the base.

3. The heat dissipation module as claimed in claim 1, wherein when the electronic assembly is disposed in the passage, the two side portions are compressed to deform, and the middle portion is moved toward the surface of the frame.

4. The heat dissipation module as claimed in claim 1, wherein the frame comprises:
two longitudinal panels facing each other; and
two transversal panels each connected to the two longitudinal panels;
wherein the edges of the two longitudinal panels that are adjacent to the base are distant from the base, and two air path inlets are formed between the two longitudinal panels and the base.

5. The heat dissipation module as claimed in claim 1, wherein the frame comprises a plurality of panels, wherein ends of the panels that are approximate to the base have a curved structure extending outwardly in a direction away from the passage.

6. The heat dissipation module as claimed in claim 1, wherein the surface has an opening, and when the electronic assembly is disposed in the passage, the opening faces the electronic assembly.

7. The heat dissipation module as claimed in claim 1, wherein the surface of the frame has an opening facing the positioning member.

8. The heat dissipation module as claimed in claim 1, wherein when the electronic assembly is disposed in the passage, and at least a portion of the electronic assembly is exposed to the outside of the frame.

9. The heat dissipation module as claimed in claim 1, further comprising a housing, wherein the housing has an opening, and the passage of the frame faces the opening of the housing.

10. The heat dissipation module as claimed in claim 9, wherein when the electronic assembly is disposed in the passage, at least a portion of the electronic assembly is exposed to the outside of the housing and the frame.

11. The heat dissipation module as claimed in claim 1, further comprising a housing, wherein the housing has an opening, and an orthogonal projection of the opening on the base overlaps with an orthogonal projection of the positioning member on the base.

12. The heat dissipation module as claimed in claim 1, further comprising a housing, wherein the housing has an opening, and when the electronic assembly is disposed in the passage, the electronic assembly passes through the opening and a slit is formed between the electronic assembly and an edge of the opening.

13. The heat dissipation module as claimed in claim 1, wherein the passage substantially extends in a direction that is perpendicular to the base.

14. An electronic device, adapted for receiving an electronic assembly, comprising: a base having an upper surface and a lower surface that is positioned relative to the upper surface, wherein a through hole penetrates the upper surface and the lower surface of the base; a circuit board disposed on the lower surface of the base, and comprising an electronic connector disposed in the through hole and exposed by the upper surface; a frame disposed on the upper surface of the base and having a passage facing the electronic connector, wherein at least a segment of an edge of the frame that is adjacent to the base is distant from the base, and an air path inlet is formed between the segment of the edge of the frame and the base, the air path inlet communicates with the passage; and a positioning member is disposed in the passage and is connected to a surface of the frame, wherein the positioning member comprises a metal sheet, and the metal sheet comprises: a middle portion comprising a flat surface, wherein when the electronic assembly is disposed in the passage, the flat surface of the middle portion is in direct contact with the surface of the electronic assembly; and two side portions connected to two sides of the middle portion, wherein the positioning member is connected to the surface of the frame via the two side portions, and the middle portion is separated from the surface of the frame by the clap; wherein when the electronic assembly is disposed in the passage, the electronic assembly is abutted against the positioning member and is electrically connected to the electronic connector, and there is a gap formed between the positioning member and the surface that allows an air current to flow through.

* * * * *